US012308300B2

(12) United States Patent
Park et al.

(10) Patent No.: US 12,308,300 B2
(45) Date of Patent: May 20, 2025

(54) DOUBLE-SIDED COOLING TYPE POWER MODULE

(71) Applicants: Hyundai Motor Company, Seoul (KR); Kia Motors Corporation, Seoul (KR)

(72) Inventors: Jun Hee Park, Gyeonggi-do (KR); Tae Hwa Kim, Gyeonggi-do (KR); Hyeon Uk Kim, Gyeonggi-do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 330 days.

(21) Appl. No.: 16/996,135

(22) Filed: Aug. 18, 2020

(65) Prior Publication Data

US 2021/0265235 A1     Aug. 26, 2021

(30) Foreign Application Priority Data

Feb. 25, 2020 (KR) .................. 10-2020-0023156

(51) Int. Cl.
*H01L 23/373* (2006.01)
*H05K 7/20* (2006.01)

(52) U.S. Cl.
CPC ...... *H01L 23/3735* (2013.01); *H01L 23/3737* (2013.01); *H05K 7/209* (2013.01)

(58) Field of Classification Search
CPC ............... H01L 23/373; H01L 23/3738; H01L 23/3735; H01L 23/4334; H01L 23/42;

(Continued)

(56) References Cited

U.S. PATENT DOCUMENTS 4,788,627 A * 11/1988 Ehlert ............... H01L 24/29
174/16.3
5,296,310 A * 3/1994 Kibler ............... B32B 15/20
428/614

(Continued)

FOREIGN PATENT DOCUMENTS

CN     102664177 A     9/2012
CN     104582251 A     4/2015

(Continued)

OTHER PUBLICATIONS

Office Action issued Jul. 17, 2024 in corresponding Korean Patent Application No. 10-2020-0023156.

(Continued)

*Primary Examiner* — Evren Seven
(74) *Attorney, Agent, or Firm* — Fox Rothschild LLP

(57) ABSTRACT

A double-sided cooling type power module according to the present invention includes: an upper substrate including an insulating layer, an upper metal layer bonded to a top of the insulating layer, and a lower metal layer bonded to a bottom of the insulating layer; a lower substrate disposed under the upper substrate and including an insulating layer, an upper metal layer bonded to a top of the insulating layer, and a lower metal layer bonded to a bottom of the insulating layer; a spacer disposed between the upper substrate and the lower substrate and electrically connecting the upper substrate and the lower substrate; and a semiconductor chip disposed between the spacer and the upper substrate or the lower substrate, in which the insulating layers are made of a material of which a coefficient of thermal expansion is 0.8 or more and 1.2 or less times of coefficients of thermal expansion of the metal layers of the upper substrate and the lower substrate.

9 Claims, 3 Drawing Sheets

(58) Field of Classification Search
CPC .......... H01L 23/3737; C09J 2301/408; H05K 7/20481
See application file for complete search history.

(56) References Cited

U.S. PATENT DOCUMENTS

| | | | | |
|---|---|---|---|---|
| 5,978,221 | A * | 11/1999 | Sawa | H01L 23/3737 428/313.5 |
| 6,165,612 | A * | 12/2000 | Misra | C08L 81/06 156/60 |
| 2005/0022971 | A1* | 2/2005 | Collins | H01L 23/3737 257/E23.107 |
| 2007/0148467 | A1* | 6/2007 | St. Lawrence | H05K 1/0373 428/411.1 |
| 2007/0164424 | A1* | 7/2007 | Dean | H01L 23/4275 257/E23.087 |
| 2013/0189514 | A1* | 7/2013 | Nishiyama | H01L 23/3737 428/323 |
| 2014/0015000 | A1* | 1/2014 | Nishiyama | C08K 3/38 257/793 |
| 2014/0248504 | A1* | 9/2014 | Song | B32B 25/14 524/404 |
| 2015/0037575 | A1* | 2/2015 | Sakaguchi | H01L 23/49551 156/60 |
| 2015/0079401 | A1* | 3/2015 | Ohno | C08G 59/4042 252/75 |
| 2016/0009975 | A1* | 1/2016 | Timmerman | C08K 3/042 252/75 |
| 2020/0079063 | A1* | 3/2020 | Sugimoto | B32B 27/20 |
| 2020/0090831 | A1* | 3/2020 | Sugimoto | B32B 27/38 |
| 2021/0013136 | A1* | 1/2021 | Cho | H01L 23/49861 |
| 2022/0013432 | A1* | 1/2022 | Shimazu | H01L 23/4334 |

FOREIGN PATENT DOCUMENTS

| | | |
|---|---|---|
| CN | 106415827 A | 2/2017 |
| CN | 108231709 A | 6/2018 |
| KR | 10-2017-0099725 A | 9/2017 |
| KR | 10-2018-0031502 A | 3/2018 |
| KR | 10-2018-0069231 A | 6/2018 |
| KR | 10-2018-0069943 A | 6/2018 |

OTHER PUBLICATIONS

Office Action issued on Feb. 21, 2025 in corresponding Chinese Patent Application No. 202010928385.3.

* cited by examiner

FIG. 3

| ITEMS | | MATERIAL | CTE($10^{-5}$/K) | E-Modulus (Gpa) | THICKNESS | CTE OF SUBSTRATE SURFACE | DIFFERENCE IN CTE |
|---|---|---|---|---|---|---|---|
| POWER MODULE OF RELATED ART (FIG. 1) | INSULATING LAYER | Al2O3 | 6.8 | 340 | 0.38 | 10.56 | AlSic SPACER: 2.56 LARGE DIFFERENCE IN Cu SPACER: 6 → IMPOSSIBLE TO EMPLOY Cu SPACER |
| | METAL LAYER (PATTERN) | Cu | 16.5 | 115 | 0.3 | | |
| | SPACE | AlSic | 8 | 130 | 2.45 | | |
| STRUCTURE OF PRESENT DISCLOSURE (FIG. 2) | INSULATING LAYER | THERMAL CONDUCTIVE RESIN | 13 | 50 | 0.2 | 16.22 | Cu SPACER: 0.28 SMALL DIFFERENCE → POSSIBLE TO EMPLOY Cu SPACER |
| | METAL LAYER (PATTERN) | Cu | 16.5 | 115 | 0.5 | | |
| | SPACE | Cu | 16.5 | 115 | 0.5 | | |

DOUBLE-SIDED COOLING TYPE POWER MODULE

CROSS REFERENCE TO RELATED APPLICATION

The present application claims priority to Korean Patent Application No. 10-2020-0023156, filed Feb. 25, 2020, the entire contents of which is incorporated herein for all purposes by this reference.

TECHNICAL FIELD

The present disclosure relates to a double-sided cooling type power module. The double-sided cooling type power module may have improved heat dissipation characteristic and durability.

BACKGROUND

An inverter has attracted attention as a part that is used to drive eco-friendly vehicles (hybrid vehicles and electric vehicles). A power module is one of the parts charging the most part of the manufacturing cost of an inverter and many researches have been conducted to increase the power, decrease the size, and reduce the manufacturing cost. Further, power modules of double-faced cooling have been actively studied to reduce the sizes of power modules and improve the cooling efficiency of power modules.

Power modules of double-faced cooling include a plurality of semiconductor chips between a top substrate and a bottom substrate and are configured such that heat from the semiconductors is removed by a cooler disposed outside the two substrates, so it was possible to reduce the sizes of the power modules and improve the cooling efficiency.

A power module of the related art, as shown in FIG. 1, has a stacked structure of an insulating substrate, a spacer, and an insulating substrate, in which the components are bonded through solder. In order to improve the durability of the stacked structure of the power module, it is required to minimize the differences of the Coefficients of Thermal Expansion (CTE) between materials.

By using the insulating substrate made of ceramic in the power module of the related art, the CTE of the surface of a copper pattern can be reduced by the ceramic, so it is 9.14 in comparison to 16.5 that is the CTE of copper. A Metal Matrix Composite (MMC) is used to reduce the CTEs between materials, but the MMC is expensive because the manufacturing method is difficult. Further, the MMC has a low CTE but the thermal conductivity is poor, so there is a limit that the thermal characteristic of a power module is deteriorated To this end, it is required to develop materials and structures for power modules that can improve the balance of CTEs in a stacked structure of a power module and can improve thermal characteristic of a power module.

SUMMARY OF THE INVENTION

In preferred aspects, provided is a double-sided cooling type power module that can have an improved balance of CTEs and an improved thermal characteristic.

In an aspect, provided is a double-sided cooling type power module that may include: i) an upper substrate including a first insulating layer, a first upper metal layer bonded to a top of the first insulating layer, and a first lower metal layer bonded to a bottom of the first insulating layer; ii) a lower substrate disposed under the upper substrate and including a second insulating layer, a second upper metal layer bonded to a top of the second insulating layer, and a second lower metal layer bonded to a bottom of the second insulating layer; iii) a spacer disposed between the upper substrate and the lower substrate and electrically connecting the upper substrate and the lower substrate; and iv) a semiconductor chip disposed between the spacer and the upper substrate or between the spacer and the lower substrate. In particular, each of the first and the second insulating layers may include a material having a coefficient of thermal expansion of about 0.8 times or greater and about 1.2 times or less of coefficients of thermal expansion of the first upper and lower metal layers of the upper substrate and the second upper and lower metal layers of the lower substrate.

The spacer and the first upper and lower metal layers of the upper substrate and the second upper and lower metal layers of the lower substrate may be made of the same material.

The spacer may include a metal material having a thermal conductivity of about 300 W/mK or greater.

Each of the first and second insulating layers may include a resin material having a coefficient of thermal expansion of about 13 or greater and a Young's modulus of about 50 GPa or less.

Each of the first and second insulating layers may include a resin material having a thermal conductivity of about 15 W/mK or greater and a thickness of about 0.2 mm or less.

The resin material may include one or more selected from the group consisting of alumina ($Al_2O_3$), boron nitride (BN), and aluminum nitride (AlN).

Preferably, a content boron nitride may be greater than a content of the alumina and/or the aluminum nitride.

Coefficients of thermal expansion of surfaces of the upper substrate and the lower substrate may be derived from the following formula.

$$\text{CTE of surface of substrate} = \text{CTE of insulating layer} + (\text{CTE of metal layer} - \text{CTE of insulating layer}) \times \{\text{Young's modulus of 2} \times \text{metal layer} \times \text{thickness of metal layer} / (\text{Young's modulus of 2} \times \text{metal layer} \times \text{thickness of metal layer} + \text{Young's modulus of insulating layer} \times \text{thickness of insulating layer})\}.$$ [Formula]

Thicknesses of the first upper and lower metal layers of the upper substrate, the second upper and lower metal layers of the lower substrate and the spacer may be the same, and each of the thicknesses of the first upper and lower metal layers of the upper substrate, the second upper and lower metal layers of the lower substrate, and the spacer may be greater than each thickness of the first and second insulating layers.

A first cooler may be disposed outside the first upper metal layer of the upper substrate and a second cooler may be disposed on the second lower metal layer of the lower substrate.

A Thermal Interface Material (TIM) may be disposed between the first upper metal layer and the first cooler and/or between the second lower metal layer of the lower substrate and the second cooler.

The first upper and lower metal layers of the upper substrate, the second upper and lower metal layers of the lower substrate, and the spacer may include a copper material.

Each thickness of the first upper and lower metal layers of the upper substrate, the second upper and lower metal layers of the lower substrate, and the spacer may be about 0.5 mm or greater.

Further provided is a vehicle that may include the double-sided cooling type power module as described herein.

The double-sided cooling type power module according to various exemplary embodiments of the present invention has the following effects.

The heat discharge performance may be improved by using the spacer made of a copper material such that the manufacturing cost may be reduced in comparison to that of the conventional power modules using the MMC as the material of the spacer.

Further, convenience of assembly may be improved because the insulating layers are disposed in the power module, heat discharge performance is high, and the coolers can be easily mounted.

Further, since resin-based insulating layers (e.g., the first and second insulating layers) having a low coefficient of thermal expansion are used in insulating substrates, a pattern of a copper material of 0.5 mm or greater may be applied, the heat discharge area may be increased, and the heat discharge characteristic may be improved.

Further, since the resin-based insulating layers (the first and second insulating layers) are used, the resin-based insulating layers may absorb shock due to pressing when the coolers are bonded to the upper substrate and the lower substrate, thereby being able to improve stability.

BRIEF DESCRIPTION OF THE DRAWINGS

The above and other aspects, features and advantages of the present disclosure will be more apparent from the following detailed description taken in conjunction with the accompanying drawings, in which:

FIG. 3 shows a table showing the materials, the characteristics, the thicknesses, and the differences of CTEs of the components in an exemplary double-sided cooling type power module according to an exemplary embodiment of the present invention and a conventional power module.

DETAILED DESCRIPTION

Figure 1:
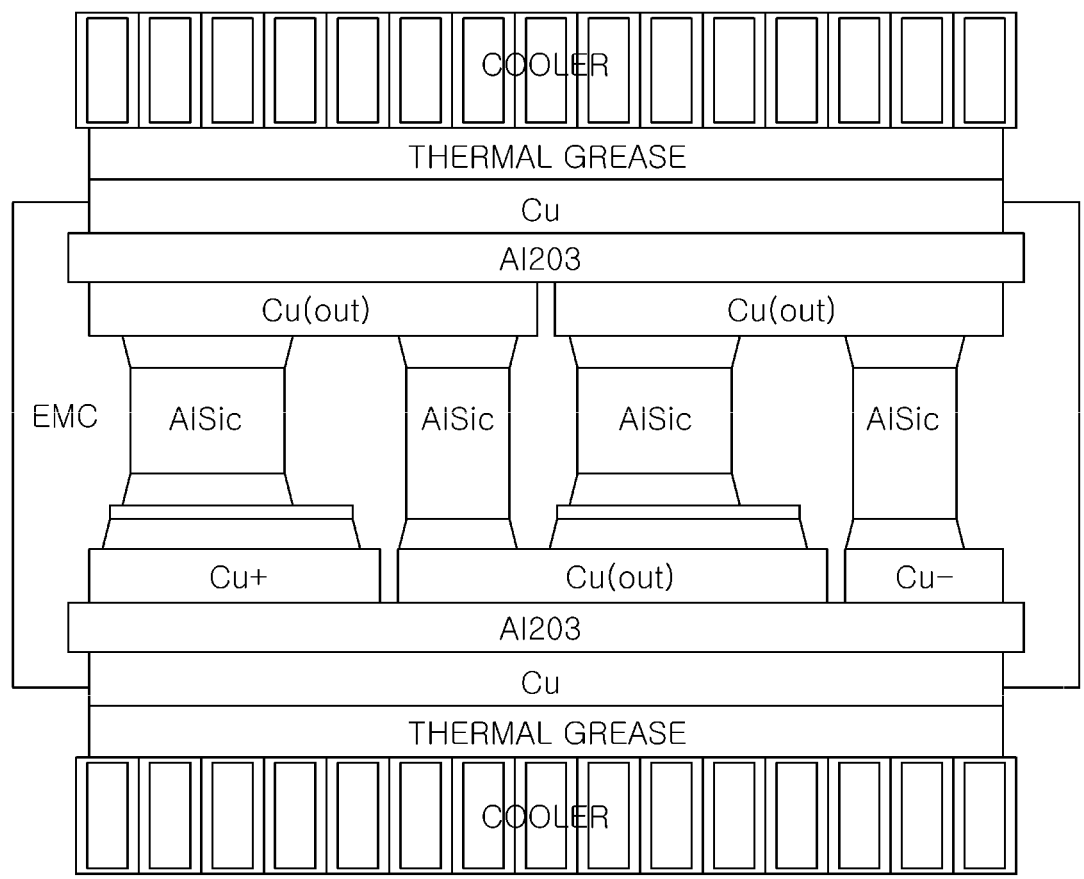
FIG. 1 shows a view showing the structure of a double-sided cooling type power module of the related art.

A specific structural or functional description of exemplary embodiments of the present invention disclosed in the specification or application is given merely for the purpose of describing the embodiment according to the present invention. Therefore, the exemplary embodiments according to the present invention may be implemented in various forms, and the present invention should not be construed as being limited to the exemplary embodiments described in the specification or application.

Various changes and modifications may be made to the embodiments according to the various exemplary embodiments of the present invention, and therefore particular embodiments will be illustrated in the drawings and described in the specification or application. However, it should be understood that embodiments according to the concept of the present invention are not limited to the particular disclosed embodiments, but the present invention includes all modifications, equivalents, and alternatives falling within the spirit and scope of the present invention.

Although the terms "ordinal numbers" such as first, second and the like may be used to describe various elements, the elements should not be defined by the terms. The terms are merely used to distinguish an element from another element, and thus a first element may be named a second element while the second element may be similarly named the first element, without departing from the scope of protection according to the concept of the present invention.

In the case where an element is referred to as being "connected" or "accessed" to other elements, it should be understood that not only the element is directly connected or accessed to the other elements, but also another element may exist between them. Contrarily, in the case where a component is referred to as being "directly connected" or "directly accessed" to another component, it should be understood that there is no component therebetween. The other expressions of describing a relation between structural elements, i.e. "between" and "merely between" or "neighboring" and "directly neighboring", should be interpreted similarly to the above description.

In the present specification, the terms are merely used to describe a specific embodiment, and are not intended to limit the present invention. As used herein, the singular forms are intended to include the plural forms as well, unless the context clearly indicates otherwise. In the description, it should be understood that the terms "comprise", "include" or "have" indicate existence of a feature, a number, a step, an operation, a structural element, parts, or a combination thereof, and do not previously exclude the existences or probability of addition of one or more another features, numeral, steps, operations, structural elements, parts, or combinations thereof.

Unless otherwise indicated, all numbers, values, and/or expressions referring to quantities of ingredients, reaction conditions, polymer compositions, and formulations used herein are to be understood as modified in all instances by the term "about" as such numbers are inherently approximations that are reflective of, among other things, the various uncertainties of measurement encountered in obtaining such values.

Further, unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

Unless defined differently, all terms used herein, which include technical terminologies or scientific terminologies, have the same meaning as that generally understood by a person skilled in the art to which the present invention belongs. It should be interpreted that the terms, which are identical to those defined in general dictionaries, have the meaning identical to that in the context of the related technique. The terms should not be ideally or excessively interpreted as a formal meaning unless not clearly defined.

The present invention will be described hereafter in detail by describing exemplary embodiments of the present invention with reference to the accompanying drawings. Like reference numerals given in the drawings indicate like components.

Figure 2:
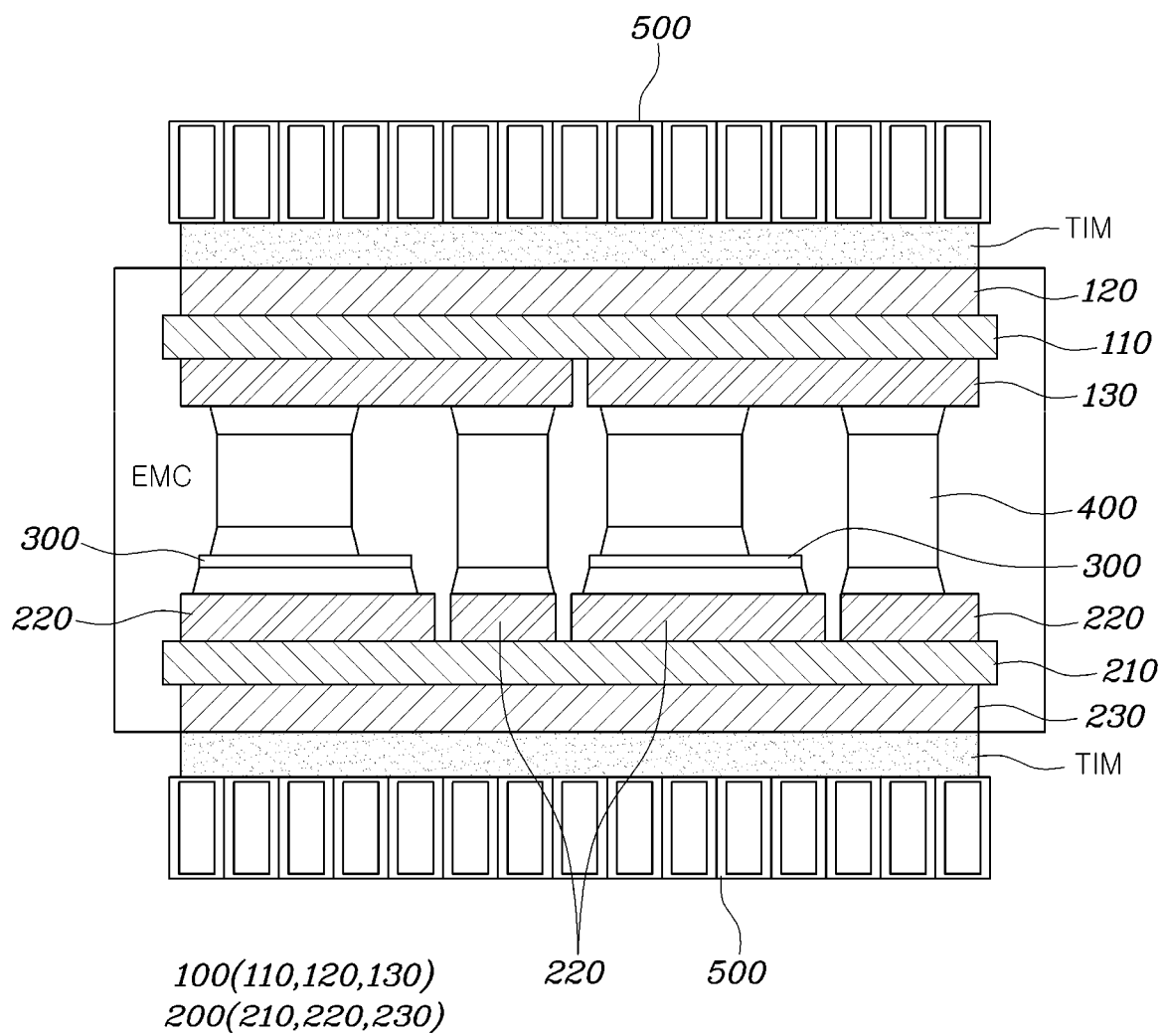
FIG. 2 shows a view showing the structure of an exemplary double-sided cooling type power module according to an exemplary embodiment of the present invention.

FIG. 2 shows a view showing the structure of an exemplary double-sided cooling type power module according to an exemplary embodiment of the present invention.

As shown in FIG. 2, a double-sided cooling type power module according to an exemplary embodiment of the present invention may include an upper plate 100, a lower plate 200, a semiconductor chip 300, a spacer 400, and coolers 500, and in detail, has a stacked structure of the lower substrate 200, the semiconductor chip 300, the spacer 400, and the upper substrate 100. In the double-sided cooling type power module having this stacked structure, the components may be bonded and stacked through adhesives on the tops and the bottoms of the components.

The double-sided cooling type power module according to an exemplary embodiment of the present invention may be the power module of the inverters of a hybrid vehicle and an electric vehicle, and in which, the cooling performance may be improved by discharging heat in two directions.

In detail, the upper substrate 100 of the double-sided cooling type power module according to the present invention may include a first insulating layer 110, a first upper metal layer 120 bonded to the top of the first insulating layer 110, and a first lower metal layer 130 bonded to the bottom of the first insulating layer 110.

The lower substrate 200 may be disposed under the upper substrate 100 and may include a second insulating layer 210, a second upper metal layer 220 bonded to the top of the second insulating layer 210, and a second lower metal layer 230 bonded to the bottom of the second insulating layer 210.

In the present invention, the upper substrate and the lower substrate may have a structure in which metal layers (i.e. first upper metal layer 120, first lower metal layer 130, second upper metal layer 220, and second lower metal layer 23) may be disposed on both sides of the insulating layers (i.e. first and second insulating layers), thereby forming one substrate, like a Direct Bonded Copper (DBC) substrate in the related art.

The semiconductor chip 300 may be disposed between the upper substrate 100 or the lower substrate 200. For example, the semiconductor chip 300 may be disposed on the upper metal layer 220 of the lower substrate 200.

The spacer 400 may be disposed between the upper substrate 100 and the lower substrate 200 and electrically connect the upper substrate 100 and the lower substrate 200.

The coolers 500 may be disposed outside the first upper metal layer 120 of the upper substrate 100 and the second lower metal layer 230 of the lower substrate 200. For instance, a first cooler 500 (top 500) may be disposed on the first upper metal layer 120 of the upper substrate 100, and a second cooler 500 (bottom 500) may be disposed on the second lower metal layer 230 of the lower substrate 200.

Hereafter, the materials and characteristics of the components of the double-sided cooling type power module according to an exemplary embodiment of the present invention for improving the balance of the coefficients of thermal expansion of the materials and the thermal characteristic of the power module having the structure described above are described in more detail.

In the double-sided cooling type power module according to an exemplary embodiment of the present invention, the spacer 400 may be made of, or include a metal material having thermal conductivity over about 300 W/Mk. For example, the spacer 400 may be made of, or include a copper material. The spacer 400 may be made of the same material as the metal layers (upper and lower metal layers 120, 130, 220, 230) of the upper substrate 100 and the lower substrate 200. Preferably, the metal layers of the upper substrate 100 and the lower substrate 200 may be made of a copper material.

A metal matrix composite (MMC) including AlSiC, CuMo, CuC, and the like has been used to reduce the differences in coefficient of thermal expansion of the components of power modules in the related art, but there was a problem that the MMC is expensive due to difficulty in manufacturing, and the coefficient of thermal expansion is low, but the thermal conductivity is poor, so the thermal characteristic of a power module is deteriorated.

As described above, by using a copper material cheaper than the MMC for the spacer according to the exemplary embodiments of the present invention, it is possible to reduce the manufacturing cost, minimize the differences in coefficient of thermal expansion between the spacer and the insulating layers. Accordingly, it is possible to prevent concentration of stress in a specific portion when a temperature cycle progresses, whereby it is possible to improve the durability of the entire power module. Further, the entire thermal characteristic of the power module can be improved by the characteristic of high thermal conductivity of a copper material.

The insulating layers 110 and 210 may be made of, or include a material having a coefficient of thermal expansion of about 0.8 times or greater and about 1.2 times or less of the coefficients of thermal expansion of the metal layers 120, 130, 220, and 230 of the upper substrate 100 and the lower substrate 200. Since the metal layers of the substrates and the spacer are made of the same material in the present invention, the insulating layers 110 and 210 may be made of, or include a material having the coefficient of thermal expansion of about 0.8 times or greater and about 1.2 times or less of the coefficient of thermal expansion of the spacer 140. For example, since the coefficient of thermal expansion of copper is about 16.5 pp/K, when the spacer 400 is made of a copper material, the coefficients of thermal expansion of the insulating layers 110 and 210 may be about 16.5×0.8 or greater and about 16.5×1.2 or less.

The insulating layers 110 and 210 of the substrates may be made of, or include a resin material having the coefficient of thermal expansion of about 13 or greater and the Young's modulus of about 50 GPa or less so that the coefficients of thermal expansion of the insulating layers 110 and 210 may be about 0.8 to 1.2 times of the coefficient of thermal expansion of the spacer 400.

Further, in order to secure the thermal characteristics of the insulating layers, the first insulating layer 110 and the second insulating layer 210 of the substrates may be made of a resin material having the thermal conductivity of about 15 W/mK or greater and the thickness of about 0.2 mm or less.

Preferably, the resin material may include one or more selected from the group consisting of alumina ($Al_2O_3$), boron nitride (BN), and aluminum nitride (AlN). The resin material may contain more boron nitride than alumina and boron aluminum. A content of the boron nitride may be greater than the contents of the alumina and/or boron aluminum.

According to a certain embodiment of the present invention, the reason that the coefficients of thermal expansion of the first and second insulating layers 110 and 210 of the substrates set to be about 0.8 to 1.2 times of the coefficient of thermal expansion of the spacer 400 may be for improving the durability of the power module by minimizing stress according to a temperature cycle by minimizing the differences in coefficient of thermal expansion between the insulating layers 110, 210 disposed on the surfaces of the insulating substrates and the spacer.

When the difference in coefficient of thermal expansion between the spacer and the insulating layers is large, stress concentrates on the top of the semiconductor chip when the temperature cycle progresses, and accordingly, the solder on the chip may be broken and the durability of the power module may be deteriorated. In order to solve this problem, in the present invention, it is possible to minimize the differences in coefficient of thermal expansion between materials by using a material of which coefficient of thermal expansion is about 0.8 to 1.2 or less times of the coefficient of thermal expansion of the spacer for the insulating layers. Accordingly, it is possible to obtain the effect of improving the durability of the entire power module by preventing concentration of stress on a specific portion of the top and the bottom of the chip when the temperature cycle progresses.

The thicknesses of the metal layers (the first upper and lower metal layers 120, 130 and the second upper and lower metal layers 220, 230) of the substrates and the spacer may be the same. For example, as described above, the metal layers and the spacer may be made of, or include a copper material and the thicknesses of the metal layer and the spacer may be about 0.5 mm or greater. Each the thicknesses of the metal layers (the first upper and lower metal layers 120, 130 and the second upper and lower metal layers 220, 230) and the spacer may be greater than each the thicknesses of the insulating layers (first and second insulating layers 110. 210) of the substrates.

A thermal interface material (TIM) may be disposed between the metal layers and the coolers disposed outside the upper metal layer 120 of the upper substrate 100 and the lower metal layer 230 of the lower substrate 200. Preferably, the TIM may be a thermal grease layer.

FIG. 3 is a table showing the materials, the characteristics, the thicknesses, and the differences of CTEs of the components in an exemplary double-sided cooling type power module according to an exemplary embodiment of the present invention and a conventional power module. As shown in FIG. 3, in the present invention, the coefficient of thermal expansion may be 13 or greater and the differences from the coefficients of thermal expansion of the metal layers (e.g., the first upper and lower metal layers 120, 130 and the second upper and lower metal layers 220, 230) may not be large, so metal layers of about 0.5 mm or greater may be used. Accordingly, the heat discharge performance of the entire power module may be improved by increasing the heat discharge area.

The coefficients of thermal expansion of the substrates of the substrates described in FIG. 3 can be derived on the basis of the following formula.

CTE of surface of substrate=CTE of insulating layer+(CTE of metal layer−CTE of insulating layer)×{Young's modulus of 2×metal layer× thickness of metal layer/(Young's modulus of 2×metal layer×thickness of metal layer+Young's modulus of insulating layer×thickness of insulating layer)}. [Formula]

According to various exemplary embodiments of the present invention, the double-sided cooling type power module having the structure and the characteristics of materials described above are described hereafter.

The double-sided cooling type power module according to various exemplary embodiments of the present invention may improve the heat discharge performance by using the spacer made of a copper material and the manufacturing cost thereof may be reduced in comparison to that of the power modules of the related art including the MMC as the material of the spacer.

Further, convenience of assembly may be improved because the insulating layers are disposed in the power module, heat discharge performance is high, and the coolers can be easily mounted.

Further, since resin-based insulating layers having a low coefficient of thermal expansion are used in the upper substrate and the lower substrate, a pattern of a copper material of 0.5 mm or greater may be applied, the heat discharge area may be increased, and the heat discharge characteristic may be improved.

Further, since the resin-based insulating layers are used, the resin-based insulating layers may absorb shock due to pressing when the coolers are bonded to the upper substrate and the lower substrate, thereby being able to improve stability.

What is claimed is:

1. A double-sided cooling type power module, comprising:
    an upper substrate comprising a first insulating layer, a first upper metal layer bonded to a top of the first insulating layer, and a first lower metal layer bonded to a bottom of the first insulating layer;
    a lower substrate disposed under the upper substrate and comprising a second insulating layer, a second upper metal layer bonded to a top of the second insulating layer, and a second lower metal layer bonded to a bottom of the second insulating layer;
    a spacer disposed between the upper substrate and the lower substrate and electrically connecting the upper substrate and the lower substrate;
    a semiconductor chip disposed between the spacer and the upper substrate or between the spacer and the lower substrate,
    wherein the insulating layers comprises a material of which a coefficient of thermal expansion is about 0.8 times or greater and about 1.2 times or less of coefficients of thermal expansion of the metal layers of the upper substrate and the lower substrate;
    wherein the coefficients of thermal expansion of the metal layers of the upper substrate and the lower substrate are 16.5 pp/K; and
    wherein a thickness of each of the spacer, the first upper and lower metal layers of the upper substrate, and the second upper and lower metal layers of the lower substrate is about 0.5 mm or greater;
    a first cooler disposed outside the first upper metal layer of the upper substrate;
    a second cooler disposed outside of the second lower metal layer of the lower substrate; and
    a thermal interface material (TIM) disposed between at least one of the first upper metal layer and the first cooler or the second lower metal layer and the second cooler;
    wherein the TIM is made of a different material from the first and second insulating layers, wherein each of the first and second insulating layers comprises a resin material, wherein the resin material comprises alumina ($Al_2O_3$), boron nitride (BN), and aluminum nitride (AlN), and wherein a content of the boron nitride is greater than a content of the alumina and a content of the aluminum nitride, respectively.

2. The power module of claim 1, wherein the spacer, the first upper and lower metal layers of the upper substrate, and the second upper and lower metal layers of the lower substrate are made of the same material.

3. The power module of claim 1, wherein the spacer comprises a metal material of which a thermal conductivity is about 300 W/mK or greater.

4. The power module of claim 1, wherein the resin material having a coefficient of thermal expansion of about 13 or greater and a Young's modulus of about 50 GPa or less.

5. The power module of claim 1, wherein the resin material having a thermal conductivity of about 15 W/mK or greater and a thickness of about 0.2 mm or less.

6. The power module of claim 1, wherein coefficients of thermal expansion of surfaces of the upper substrate and the lower substrate are derived from the following formula, CTE of surface of substrate=CTE of insulating layer+(CTE of metal layer−CTE of insulating layer)×{Young's modulus of 2×metal layer× thickness of metal layer/(Young's modulus of 2×metal layer×thickness of metal layer+Young's modulus of insulating layer×thickness of insulating layer)}. [Formula]

7. The power module of claim 1, wherein thicknesses of the first upper and lower metal layers, the second upper and lower metal layers and the spacer are the same, and each of the thicknesses of the first upper and lower metal layers and the second upper and lower metal layers and the spacer is greater than thicknesses of the insulating layers.

8. The power module of claim 2, wherein each of the spacer, the first upper and lower metal layers of the upper substrate, and the second upper and lower metal layers of the lower substrate comprises a copper material.

9. A vehicle comprising a power module of claim 1.

* * * * *